United States Patent [19]
Den et al.

[11] Patent Number: 5,583,093
[45] Date of Patent: Dec. 10, 1996

[54] METAL OXIDE MATERIAL WITH LN, SR, CU, O, OPTIONALLY CA, AND AT LEAST ONE OF FE, CO, TI, V, GE, MO, AND W

[75] Inventors: Tohru Den, Tokyo; Tamaki Kobayashi, Atsugi, both of Japan

[73] Assignee: Canon Kabushiki Kaisha, Tokyo, Japan

[21] Appl. No.: 473,362

[22] Filed: Jun. 7, 1995

Related U.S. Application Data

[62] Division of Ser. No. 266,319, Jun. 20, 1994, Pat. No. 5,512,538, which is a continuation of Ser. No. 47,618, Apr. 16, 1993, abandoned, which is a continuation of Ser. No. 854,401, Mar. 19, 1992, abandoned.

[30] Foreign Application Priority Data

| | | | |
|---|---|---|---|
| Mar. 22, 1991 | [JP] | Japan | 3-83285 |
| Sep. 24, 1991 | [JP] | Japan | 3-270467 |
| Feb. 26, 1992 | [JP] | Japan | 4-72994 |

[51] Int. Cl.$^6$ .......... H01B 12/00; C04B 35/45; C04B 35/50; C04B 35/505
[52] U.S. Cl. .......... 505/126; 505/781; 505/778; 505/125; 505/779; 505/780; 501/123; 252/521; 252/520; 252/519; 252/518
[58] Field of Search ................ 505/781, 778, 505/126, 125, 779, 780; 501/123; 252/521, 520, 519, 518

[56] References Cited

U.S. PATENT DOCUMENTS

| | | | |
|---|---|---|---|
| 5,019,553 | 5/1991 | Akimitsu et al. | 505/1 |
| 5,071,827 | 12/1991 | Lafon et al. | 505/780 X |
| 5,175,140 | 12/1992 | Fujita et al. | 505/779 X |
| 5,374,611 | 12/1994 | Dabrowski et al. | 505/778 X |
| 5,418,214 | 5/1995 | Toreki et al. | 505/778 X |
| 5,512,538 | 4/1996 | Den et al. | 505/126 |

FOREIGN PATENT DOCUMENTS

| | | |
|---|---|---|
| 0283317 | 9/1988 | European Pat. Off. |
| 0292340 | 11/1988 | European Pat. Off. |
| 0296893 | 12/1988 | European Pat. Off. |
| 0344352 | 6/1989 | European Pat. Off. |
| 01108147 | 4/1949 | Japan |
| 63-291817 | 11/1988 | Japan |
| 64-83554 | 3/1989 | Japan |
| 64-61340 | 3/1989 | Japan |
| 1-93458 | 4/1989 | Japan |
| 1122959 | 5/1989 | Japan |
| 1160821 | 6/1989 | Japan |
| 00160821 | 6/1989 | Japan |
| 1179719 | 7/1989 | Japan |
| 1176219 | 7/1989 | Japan |
| 1176218 | 7/1989 | Japan |
| 1212230 | 8/1989 | Japan |
| 1212229 | 8/1989 | Japan |
| 1264954 | 10/1989 | Japan |
| 2164759 | 6/1990 | Japan |

OTHER PUBLICATIONS

Journal of Solid State Chemistry, vol. 95, No. 1, Nov. 1991, R. Suryanarayanan et al., "Possible Superconductivity and Microstructural Investigation in $Y_{1-x}Ca_xSrCu_{2.6}Fe_{0.4}O_{6+z}$ (x=0,0.1)".

M. Oda et al., "Oxygen Deficiency in $YM_2CU_3O_{7+y}$ (M=Ba, Sr) Family," Japanese Journal of *Applied Physics*, vol. 26, No. 5, May 1985, pp. L804–L806.

Z. Qi–rui et al., "Superconductivity in Sr—Y—Cu—O System," *Solid State Communications*, vol. 63, No. 6, 1987, pp. 535–636 month not known.

S. A. Sunshine et al., "Stabilization of Strontium Analogues of Barium Yttrium Cuprate Pervskites via Chemical Substitution", *Chemistry of Materials*, vol. 1, No. 3, May/Jun. 1989, pp. 331–335.

D. C. Johnston et al., "High Temperature Superconductivity In The Li—Ti—O Ternary System," *Materials Research Bulletin*, vol. 8, No. 7, Jul. 1973 pp. 777–784.

A. W. Sleight et al., "High–Temperature Superconductivity In the $BaPb_{1-x}Bi_xO_3$ System," *Solid State Communications*, vol. 17, Jul. 1973, pp. 27–28.

J. G. Bednorz et al., "Possible High $T_c$ Superconductivity in the Ba—La—Cu—O System," *Condensed Matter* (Zeitschrift fur Physik B), vol. 64, No. 2, 1986, pp. 189–193 month not known.

M. K. Wu et al., "Superconductivity at 93 K in a New Mixed–Phase Y—Ba—Cu—O Compound System," *Physical Review Letters*, vol. 58, No. 9, Mar. 2, 1987, pp. 908–912.

"High–Pressure synthesis of superconducting $YSr_2Cu_3O_y$, $La_{1.7}Ca_{13}Cu_2O_y$ and etc.," *Reported by B. Okai, Preprint for Autumnal Meeting of Japan Physical Society*, Third Part, p. 243, 1990 month not known.

Kishio "High Tc Superconducting Oxide Solid Solutions" *Chemistry Letters*, 1987, pp. 635–638 month not known.

Murphy "New Superconducting Cuprate Perkovites" *Phys. Rev. Lett* V58(18) May 4, 1987, pp. 1888–1890.

Den, Tohru, et al., "Preparation and properties of $YSr_2Cu_{3-x}M_xO_y$ (M=Li, Al, Ti, V, Cr, Fe, Co, Ga, Ge, Mo, W and Re)", *Physica C*, 196, 1 & 2 (10 Jun. 1992), 141–152.

Slater, P. R., et al., "Synthesis and structural characterisation of $YSr_2Cu_{3-x}M_xO_{7\pm y}$ (M=Fe, Ti, Al, Co, G, Pb; 0.5<x<1), and the non-existence of the parent phase $YSr_2Cu_3O_y$", *Physica C*, 180 (5&6) (15 Sep. 1991), 299–306.

Roth, G., et al., "The crystal structure of RESr2GaCu2O7", *Journal de Physique I*, 1 (5) (May 1991), 721–741.

*Primary Examiner*—Douglas J. McGinty
*Attorney, Agent, or Firm*—Fitzpatrick, Cella, Harper & Scinto

[57] ABSTRACT

Provided is a metal oxide material represented by the composition formula of $Ln_aSr_bCu_{3-x}M_xO_c$, where $2.7 \leq a+b \leq 3.3$; $0.8 \leq a \leq 1.2$; $6 \leq c \leq 9$; and $0.05 \leq x \leq 0.7$, Ln is at least one element selected from the group of elements of Y and lanthanoids or an atomic group consisting of said elements, and M is at least one element selected from the group of elements of Ti, V, Ga, Ge, Mo, W and Re or an atomic group consisting of said elements.

10 Claims, 6 Drawing Sheets

METAL OXIDE MATERIAL WITH LN, SR, CU, O, OPTIONALLY CA, AND AT LEAST ONE OF FE, CO, TI, V, GE, MO, AND W

This application is a division of application Ser. No. 08/266,319 filed Jun. 20, 1994, now U.S. Pat. No. 5,512,538, which is a continuation of application Ser. No. 08/047,618 filed Apr. 16, 1993, now abandoned, which is a continuation of application Ser. No. 07/854,401 filed Mar. 19, 1992, now abandoned.

BACKGROUND OF THE INVENTION

1. Field of the Invention

The present invention relates to a novel metal oxide material which exhibits superconductivity. In particular, the present invention relates to a metal oxide material that is useful in various application fields of superconductivity such as sensors, electronic devices, computers, medical apparatuses, magnets, power transmission lines, energy instruments, and voltage standards. The metal oxide material of the present invention is especially effective when used as a bulk material. The metal oxide material of the present invention can be used in a state of junction or dispersion with another oxide or a metal.

2. Related Background Art

Copper-containing oxide superconductors which have been discovered in succession have critical temperatures of superconductivity (Tc) surpassing that of known metal-type superconductors such as niobium compounds. Therefore, applications thereof are intended in various fields. The known copper-containing oxide superconductors include those of Bi-system, Tl-system, Pb-system, Y-system, and La-system.

Typical of the copper-containing oxide superconductors, those composed of St, Ln (Y or a lanthanoid element), Cu and oxygen having a composition of $YSr_2Cu_3O_y$ are disclosed in papers of Japanese Journal of Applied Physics, Vol. 26, L804 (1987); Solid State Communication, Vol. 63, 535 (1987); and Preprint for Autumnal Meeting of Japan Physical Society, Third Part, page 243, [2p-PS-30]. Further, another superconductor having the composition $YSr_2Cu_{3-x}MO_y$ (M=Al, Fe, Co, or Pb, and $0.4 \leq x \leq 1.0$) is disclosed in Chemistry of Materials, Vol. 1, 331 (1989).

The aforementioned Bi-system, Tl-system, and Pb-system of superconductors undesirably have a specific gravity of as high as from 7 to 8 g/cm³, so that a bulk material (for example, a shield material) made therefrom inevitably becomes disadvantageously weighty in its entirety. A known St-based 123-phase material, which has a lower specific gravity than the above-mentioned material, has disadvantages of unavoidable contamination by a large amount of impurities, difficulty in the synthesis, and the low Tc (approximately 20K), For example, the compositions disclosed in Japanese Journal of Applied Physics, Vol. 26, L804 (1987) and Solid State Communication, Vol. 63, 535 (1987) do not give a single phase high-quality sample of $YSr_2Cu_3O_y$, but form many impurities such as $SrCuO_2$, $Sr_2CuO_3$, $Y_2SrO_4$, $Y_2CuO_5$, $SrCu_2O_2$, and $Sr_{1.75}Cu_3O_{5.13}$, thus the product is not practically useful. Thus the synthesis products of the St-based 123-phase material contain the superconducting material only in a small in even though the product is satisfactory in its light weight, and therefore are not useful.

The sample described in the aforementioned Preprint for Autumnal Meeting of Japan Physical Society, Third Part, page 243 was synthesized by means of a special apparatus employing conditions of 70 Kbar and 1380° C. which was not generally available, therefore being unsuitable for practical applications. Furthermore, even with such a special apparatus, the synthesized product exhibited a zero-resistance temperature (the temperature at which the resistance becomes zero) of about 20K.

The material disclosed in Chemistry of Materials, Vol. 1, 331 (1989), which exhibits superconductivity in the case of M=Co or Fe, and has the zero-resistance temperature of as low as 10K, has a superconductivity volume fraction of about 2%, thus being unsuitable for a superconducting material.

SUMMARY OF THE INVENTION

An object of the present invention is to provide a superconducting material which is synthesizable without using a special synthesis apparatus, without employing ultra-high pressure, and has a high quality with less impurity.

Another object of the present invention is to provide a material which has a high superconductivity transition temperature and a large superconductivity volume fraction, and has superior characteristics as a superconducting material.

Copper oxide superconductors of Bi-system, Tl-system, and Pb-system such as the aforementioned $YBa_2Cu_3O_y$, which are obtainable stably at present have an undesirably high specific gravity of 7 to 8 g/cm³, so that a bulk material (for example, a shield material) made therefrom inevitably becomes disadvantageously weighty in its entirety. Accordingly, still another object of the present invention is to provide a material which has a lower specific gravity than known copper-oxide superconductors.

A further object of the present invention is to provide a material which does not contain a toxic heavy metal in such a large quantity as in Bi-system, Tl-system, or Pb-system of materials, and does not employ a toxic starting material such as barium carbonate.

A typical Y-system material, $YBa_2Cu_3O_y$, is decomposed readily by moisture or water vapor into $Y_2O_3$, $BaCO_3$, and CuO, posing a serious problem in practical use thereof and thin film device preparation therefrom. Accordingly a still further object of the present invention is to provide a material which is not sensitive to moisture and water vapor, and has superior endurance.

Furthermore, the above $YBa_2Cu_3O_y$ characteristic deteriorates by liberation of oxygen at a high temperature. For example, the material having the composition of $YBa_2Cu_3O_y$ at room temperature will lose at 900° C. one oxygen in terms of y or 2.4% by weight. Accordingly, a still further object of the present invention is to provide a material which does not readily release oxygen at a high temperature.

According to an aspect of the present invention, there is provided a metal oxide material represented by the composition formula of $Ln_aSr_bCu_{3-x}M_xO_c$ where $2.7 \leq a+b \leq 3.3$; $0.8 \leq a \leq 1.2$; $6 \leq c \leq 9$; and $0.05 \leq x \leq 0.7$, Ln is at least one element selected from the group of elements of Y and lanthanoids, or an atomic group consisting of said elements, and M is at least one element selected from the group of elements of Ti, V, Ga, Ge, Mo, W and Re, or an atomic group consisting of said elements.

According to another aspect of the present invention, there is provided a metal oxide material represented by the composition formula of $Ln_aCa_bSr_cCu_{3-x}M_xO_d$ where $2.7 \leq a+b+c \leq 3.3$; $0.8 \leq a+b \leq 2.1$; $0.05 \leq b \leq 1.1$; $6 \leq d \leq 9$; and $0.05 \leq x \leq 1.0$, Ln is at least one element selected from the group of elements of Y and lanthanoids or an atomic group consisting of said elements, and M is at least one elements selected from the group of elements of Fe, Co, Ti, V, Ge, Mo, W and Re or an atomic group consisting of said elements.

DESCRIPTION OF THE PREFERRED EMBODIMENTS

The present invention provides a metal oxide material having a specific gravity of as low as 5 to 6 g/cm$^3$ and exhibiting superconductivity transition temperature of not lower than 20K, preferably not lower than 25K, by selecting the composition ratio of the constituting elements.

The metal oxide material of the present invention has a structure similar to $YSr_2Cu_3O_y$, which is synthesizable only at an extra-high pressure. Nevertheless it can be synthesized at a normal atmospheric pressure, and has improved characteristics of a superconductor. This can be achieved by introducing a selected transition metal to the Cu site in an optimum replacement ratio.

Further, the present invention provides a metal oxide material having superior characteristics by introducing Ca to the site of Y, Ln, or Sr without employing an oxygen atmosphere of high pressure for calcination.

The metal oxide material of the present invention may have any composition within the range described above. In the present invention, particularly preferred are copper oxide materials having a composition of $Ln_aSr_bCu_{3-x}M_xO_c$ where a=1 and b=2, and Ln is any of Y, Ho, Dy, and Gd.

A particularly preferred superconducting material is the above metal oxide material in which M=Ti, and $0.2 \leq x \leq 0.5$.

Another particularly preferred superconducting material is the above metal oxide material in which M=V, and $0.05 \leq x \leq 0.4$.

A still other particularly preferred superconducting material is the above metal oxide material in which M=Ga, and $0.25 \leq x \leq 0.7$.

A further particularly preferred superconducting material is the above metal oxide material in which M=Ge, and $0.05 \leq x \leq 0.4$.

A still further particularly preferred superconducting material is the above metal oxide material in which M=Mo, and $0.05 \leq x \leq 0.4$.

A still further particularly preferred superconducting material is the above metal oxide material in which M=W, and $0.05 \leq x \leq 0.4$.

A still further particularly preferred superconducting material is the above metal oxide material in which M=Re, and $0.05 \leq x \leq 0.4$.

A further particularly preferred superconducting material is the above metal oxide material which has a tetragonal or orthorhombic structure and a lattice constant (c) of not less than 11Å and not more than 12 Å.

A further preferable material is a metal oxide material of the above-mentioned composition having superconductivity at a temperature of not lower than 20 Kelvin, more preferably 25 Kelvin.

The calcium-substituted metal oxide material of the present invention may have any composition within the range described above. In the present invention, particularly preferred are copper oxide materials having a composition of $Ln_aCa_bSr_cCu_{3-x}M_xO_d$ where a+b+c=3.

A particularly preferred superconducting material is the above metal oxide material in which M =Fe, and $0.2 \leq x \leq 1.0$.

Another particularly preferred superconducting material is the above metal oxide material in which M =Co, and $0.2 \leq x \leq 1.0$.

A still other particularly preferred superconducting material is the above metal oxide material in which M=Ti, and $0.2 \leq x \leq 0.5$.

A further particularly preferred superconducting material is the above metal oxide material in which M=V, and $0.05 \leq x \leq 0.4$.

A still further particularly preferred superconducting material is the above metal oxide material in which M=Ge, and $0.05 \leq x \leq 0.4$.

A still further particularly preferred superconducting material is the above metal oxide material in which M =Mo, and $0.05 \leq x \leq 0.4$.

A still further particularly preferred superconducting material is the above metal oxide material in which M=W, and $0.05 \leq x \leq 0.4$.

A still further particularly preferred superconducting material is the above metal oxide material in which M=Re, and $0.05 \leq x \leq 0.4$.

A further particularly preferred superconducting material is the above metal oxide material which has a tetragonal or orthorhombic structure and a lattice constant (c) of not less than 11 Å and not more than 12 Å.

A further preferable masterial is a metal oxide material of the above-mentioned composition having superconductivity at a temperature of not lower than 20 Kelvin, more preferably 25 Kelvin.

The above-described metal oxide material of the present invention may be prepared by any of generally employed methods of heating powdery raw materials to cause reaction and sintering.

Examples of such methods are disclosed in Material Research Bulletin, Vol. 8, p. 777 (1973); Solid State Communication, Vol. 17, p. 27 (1975); Zeitschrift ruer Physik, B, Vol. 64, p. 189 (1986); Physical Review Letters, Vol. 58, No. 9, p. 908 (1987); etc. These methods are well known as general methods at present.

In case of use for a superconducting substrate in electronic devices, the metal oxide material of the present invention is effectively prepared also by melting the powdery raw materials at a high temperature by use of a flux and subsequently growing a single crystal.

For use for thin film electronic devices or shielding materials, the metal oxide material of the present invention can be formed in a thin film state on a substrate or another superconducting thin film by any of sputtering methods such as high frequency sputtering or magnetron sputtering employing a target containing the invented materials; vapor deposition such as electron beam vapor deposition, MBE and ionized cluster beam; CVD employing gases as the raw materials; and plasma CVD.

The copper oxide material of the present invention thus prepared has a superconductivity transition temperature depending on the firing conditions and the raw material composition. In particular, a high superconductivity transition temperature is obtained when the element M is Mo, W, or Re. In this case, the superconductivity transition temperature is increased up to 70K depending on the kind of the element M and the value of x. Accordingly, the metal oxide of the present invention can be used as a superconductor naturally at the liquid helium temperature, and even with a simple refrigerator.

Furthermore, the metal oxide material of the present invention can be supplied at a low price since the raw materials therefor are all inexpensive. The material of the present invention is relatively stable and deteriorates less in the open air. This material is highly safe since a toxic raw material such as a heavy metal is not used.

The metal oxide material of the present invention has a specific gravity in the range of from 5 to 6 g/cm$^3$ which is less by about 20 to 30% than existing copper oxide superconductors. This is an advantage in the case where the metal oxide material is employed as a bulk material for shielding of magnet.

The metal oxide material of the present invention is not sensitive to moisture or water vapor, which advantageously relaxes the using conditions and broadens the application fields of the product, raising the durability, and stabilizing the surface state in preparation of devices. The metal oxide material of the present invention does not readily release oxygen at a high temperature, which is an advantage for use or synthesis of the material.

The present invention is described more specifically by reference to Examples and Comparative Examples.

EXAMPLES 1 TO 7 AND COMPARATIVE EXAMPLES 1 TO 6

The starting materials used were $Y_2O_3$, $SrCO_3$, $CuO$, $TiO_2$, $V_2O_5$, $Ga_2O_3$, $GeO_2$, $MoO_3$, $WO_3$, $ReO_3$, $Al_2O_3$, $MnO_2$, $NiO$, $Fe_2O_3$, and $Co_2O_3$. These material were weighed out in desired composition ratios, and mixed at dry.

The respective mixtures were pressed into pellets with 10 mm in diameter and 1 mm thick. Each of the formed pellets was reacted and sintered in an alumina boat at a temperature of 950° to 1100° C. in the air or in an oxygen atmosphere to prepare the compounds of Example or Comparative Example of the present invention. The sample prepared in such a manner was subjected to measurement of electric resistivity by a four-probe method and measurement of magnetic susceptibility by means of a SQUID in the temperature range of from room temperature to the liquid helium temperature.

Table 1 shows the composition ratios and the transition temperatures (K) of the compounds of Examples 1 to 7. Table 2 shows the nominal compositions and the electric characteristics of the oxides of Comparative Examples 1 to 6. The composition ratios were measured by EPMA, so that the quantity of the oxygen may involve an error of about 20%.

The oxygen contents in the compounds of Comparative Examples are represented by y, because those can not be measured due to the impurity phases in the compounds.

TABLE 1

| Example No. | Composition | Characteristic (Tc) | Decrease of Tc after water-vapor exposure test (ΔTc) |
|---|---|---|---|
| 1 | $YSr_2Cu_{2.7}Ti_{0.3}O_{7.0}$ | 35K | −3K |
| 2 | $YSr_2Cu_{2.75}V_{0.25}O_{7.1}$ | 27K | −2K |
| 3 | $YSr_2Cu_{2.65}Ga_{0.35}O_{7.0}$ | 38k | −3K |
| 4 | $YSr_2Cu_{2.8}Ge_{0.2}O_{6.9}$ | 28k | −3K |
| 5 | $YSr_2Cu_{2.85}Mo_{0.15}O_{7.0}$ | 67K | −5K |
| 6 | $YSr_2Cu_{2.85}W_{0.15}O_{7.1}$ | 45K | −4K |
| 7 | $YSr_2Cu_{2.75}Re_{0.25}O_{7.2}$ | 48K | −4K |

TABLE 2

| Comparative Example No. | Nominal composition | Characteristic (Tc) |
|---|---|---|
| 1 | $YSr_2Cu_3O_y$ | semi-conductor |
| 2 | $YSr_2Cu_{2.7}Al_{0.3}O_y$ | semi-conductor |
| 3 | $YSr_2Cu_{2.6}Mn_{0.4}O_y$ | semi-conductor |
| 4 | $YSr_2Cu_{2.6}Ni_{0.4}O_y$ | semi-conductor |
| 5 | $YSr_2Cu_{2.6}Fe_{0.4}O_y$ | 9K |
| 6 | $YSr_2Cu_{2.5}Co_{0.5}O_y$ | 9K |

Table 1 shows that all of the materials of Examples of the present invention are superconductors having Tc=20K or higher. The replacement of copper with Mo, W, or Re gives superior characteristics especially suitable for a superconductor.

Table 2 shows that the materials prepared in Comparative Examples in which the M is an element other than Ti, V, Ga, Ge, Mo, W, and Re do not exhibit superconductivity, or otherwise has Tc of lower than 10K.

Figure 2:
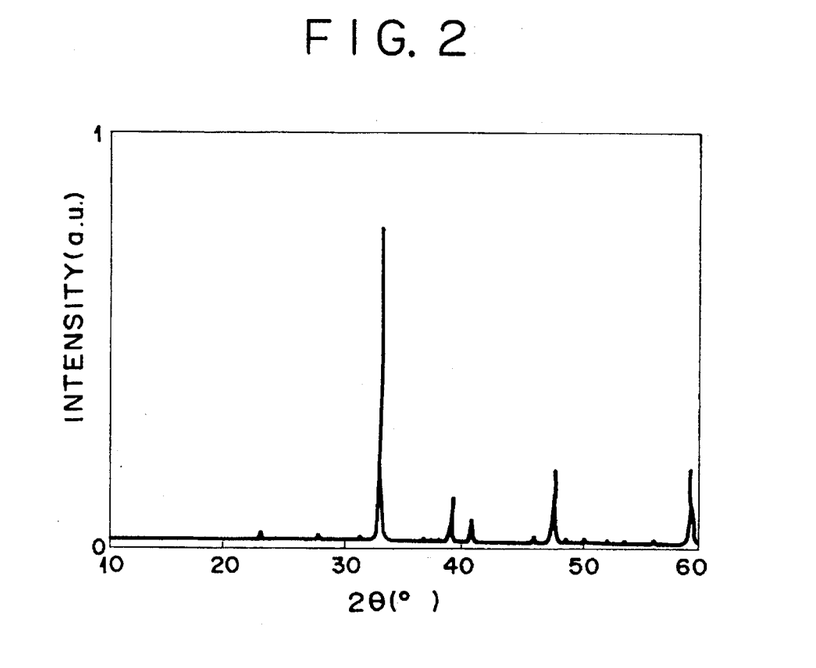
FIG. 2 shows the X-ray diffraction pattern for the $YSr_2Cu_{2.7}Ti_{0.3}O_{7.0}$ prepared in Example 1, employing the CuKα radiation.

FIG. 2 shows the X-ray diffraction pattern of the metal oxide material prepared in Example 1. From FIG. 2, the sample prepared in Example 1 has a tetragonal structure with lattice dimensions of a=b =3.83 Å, c=11.5 Å.

The materials prepared in other Examples were found to exhibit nearly the same diffraction pattern, thus having the same structure.

Figure 3:
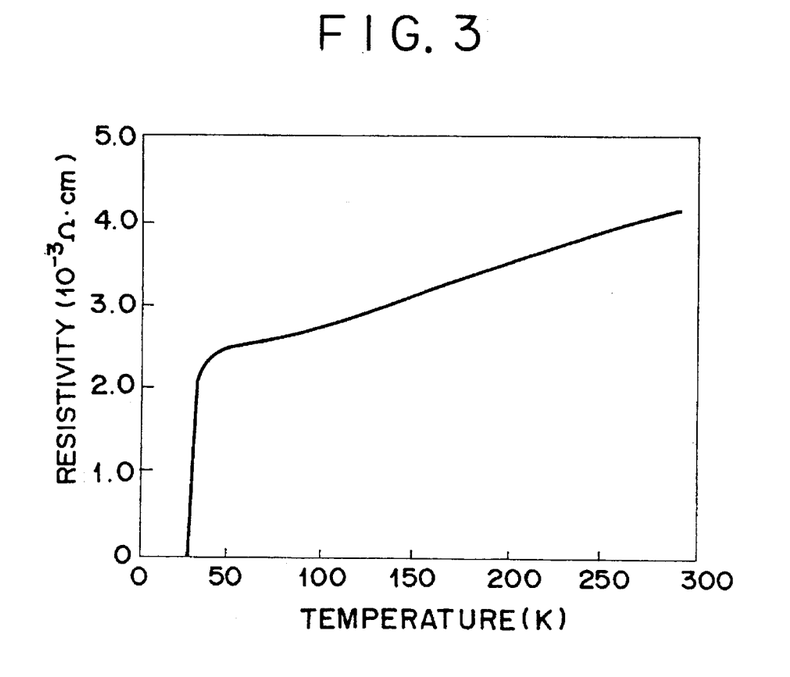
FIG. 3 shows the temperature dependence of the resistivity of the $YSr_2Cu_{2.7}Ti_{0.3}O_{7.0}$ prepared in Example 1.

FIG. 3 is a graph showing the temperature dependence of the electrical resistivity of this sample, showing that the superconductivity transition begins at approximately 40K and the resistance reaches zero at 35K. Hence, the metal oxide materials of the present invention become a superconductor at a temperature much higher than the liquid helium temperature.

Figure 4:
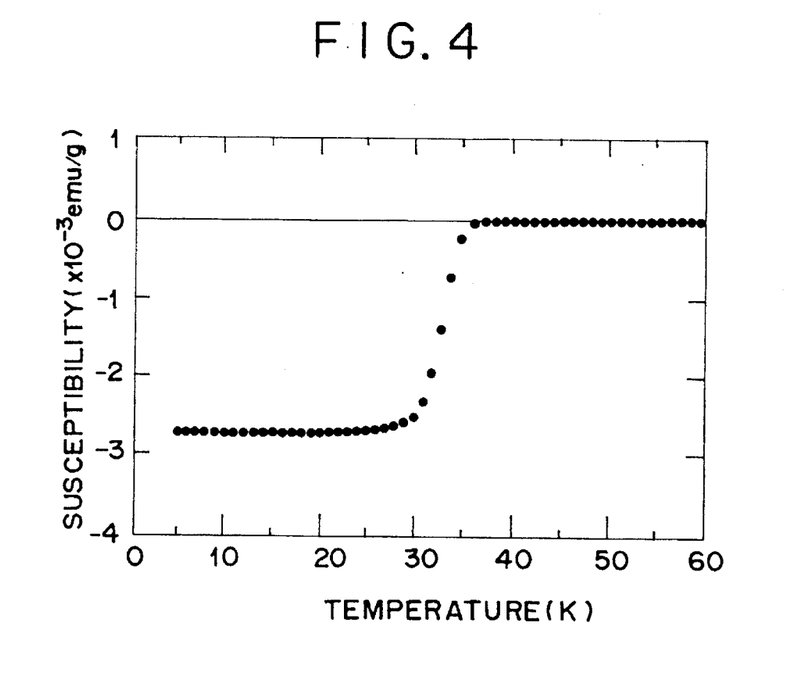
FIG. 4 shows the temperature dependence of the magnetic susceptibility of the $YSr_2Cu_{2.7}Ti_{0.3}O_{7.0}$ prepared in Example 1.

FIG. 4 shows the result of the measurement of temperature dependence of magnetic susceptibility of the metal oxide material prepared in Example 1. The sample of Example 1 exhibits Meissner signal below 35 K., and the superconductivity volume fraction thereof exceeds 20% at 10 K. The other metal oxide materials. prepared in Examples 2 to 7 give similar results, and have sufficient superconductivity.

Figure 1:
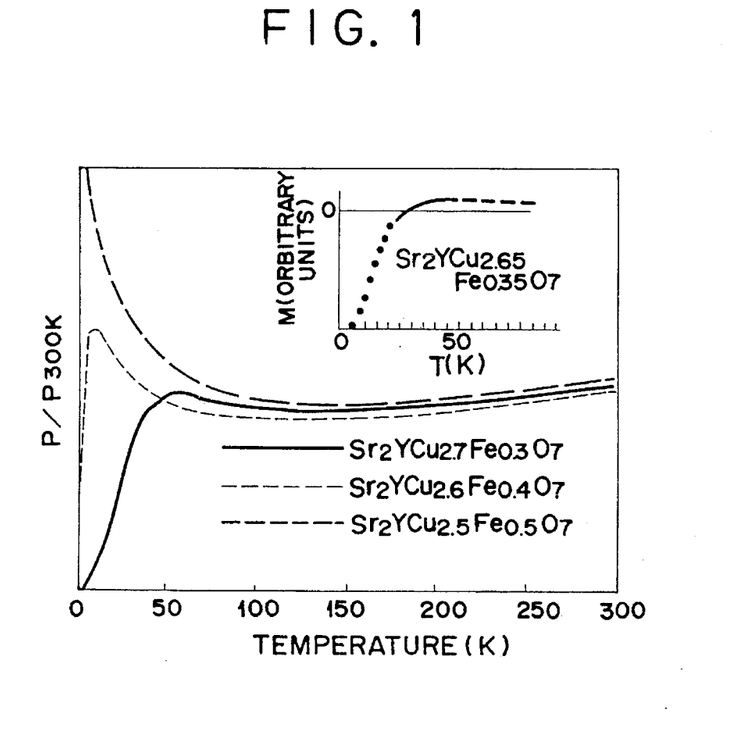
FIG. 1 shows the data for $YSr_2Cu_{3-x}Fe_xO_7$ described in Chemistry of Materials, Vol. 1, 331 (1989).

In comparison of the material of the present invention with the data for $YSr_2Cu_{3-x}Fe_xO_y$ shown in FIG. 1 cited from Chemistry of Materials, Vol. 1, 331 (1989), the material of the present invention has a much higher zero-resistivity-temperature and a much higher superconductivity volume fraction.

Figure 5:
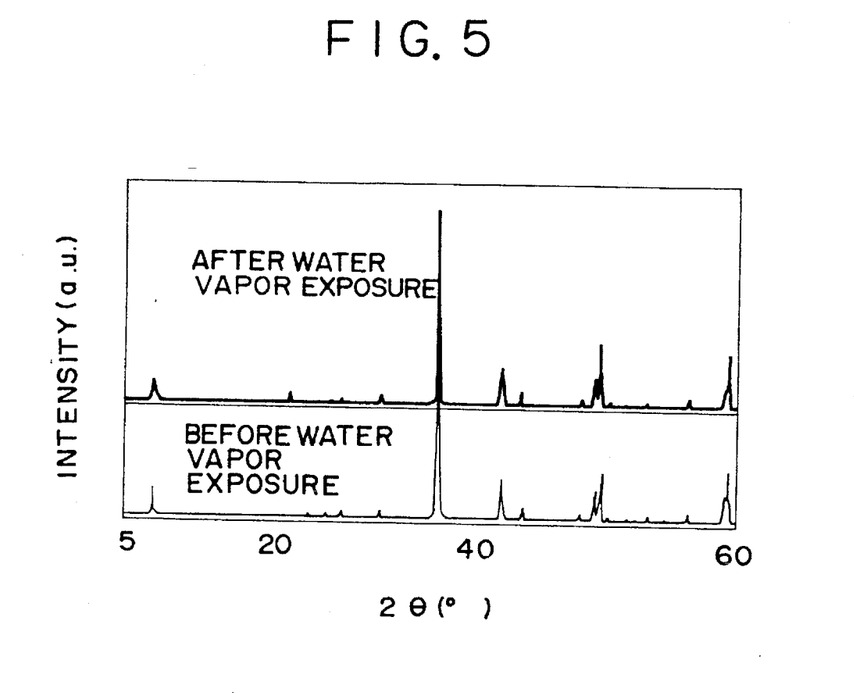
FIG. 5 shows the X-ray diffraction patterns of the $YSr_2Cu_{2.75}Re_{0.25}O_{7.2}$ prepared in Example 7 before and after the water-vapor exposure.
Figure 6:
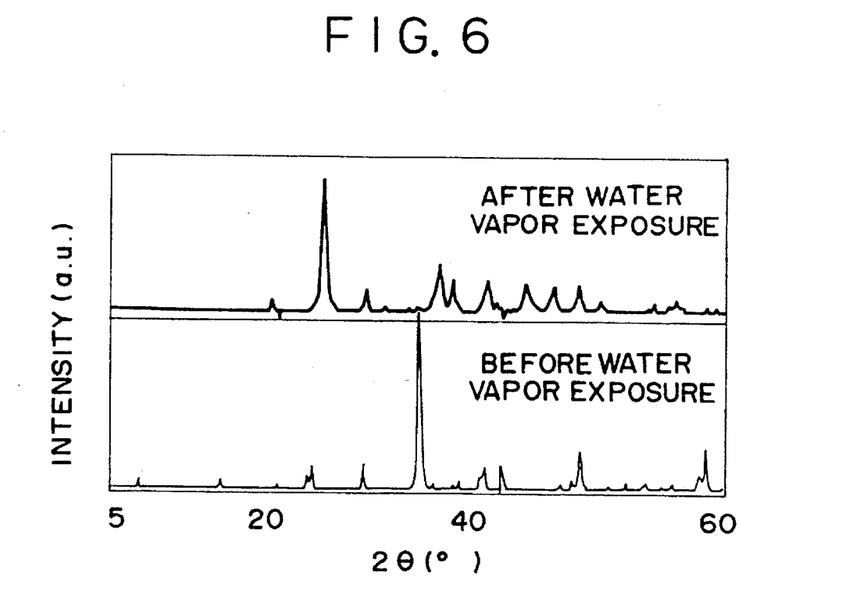
FIG. 6 shows the X-ray diffraction patterns of the $YBa_2Cu_3O_y$ prepared in Comparative Example before and after the water-vapor exposure.

The specific gravity of the material of Example 1 is 5.5 g/cm$^3$, being lower by approximately 30% than existing copper oxide superconductors such as $YBa_2Cu_3O_7$. The other materials prepared in Examples 2 to 7 also have a specific gravity of not higher than 6 g/cm$^3$, thereby being sufficiently light FIG. 5 shows the X-ray diffraction patterns of the metal oxide material prepared in Example 7 before and after the water-vapor exposure test as described below. FIG. 6 shows the X-ray diffraction patterns of the $YBa_2Cu_3O_7$ prepared in Comparative Example before and after the water-vapor exposure test. The water-vapor exposure test, namely the test for the durability against water was carried out by exposing the sample to water vapor at 40° C. for 50 hours. As the results show, in FIG. 5, no change of the X-ray patterns is observed, while, in FIG. 6, the $YBa_2Cu_3O_7$ almost loses the original structure, giving peaks attributed to $BaCO_3$, $Y_2O_3$, and CuO. The sample of $YBa_2Cu_3O_7$ exhibiten no superconductivity.

Figure 7:
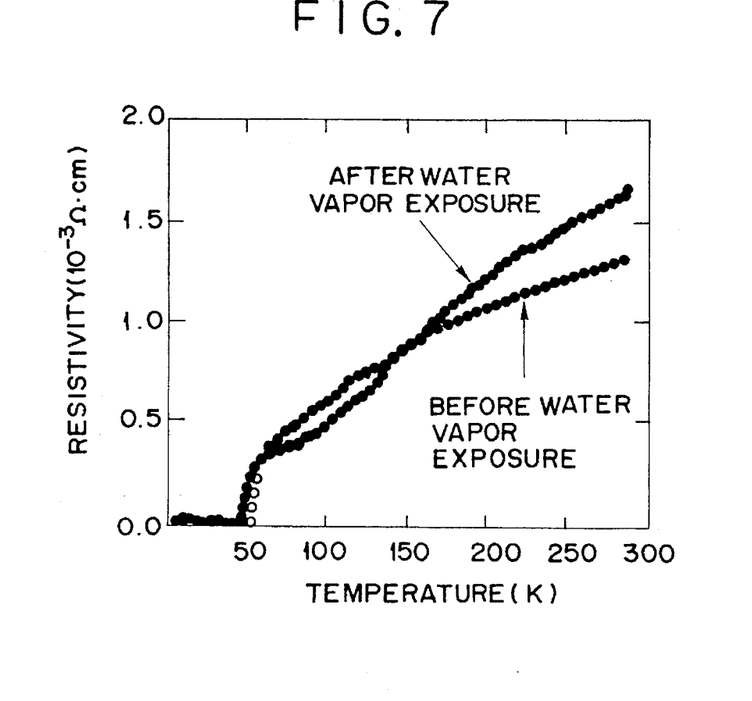
FIG. 7 shows the temperature dependences of the resistivity of the $YSr_2Cu_{2.75}Re_{0.25}O_{7.2}$ prepared in Example 7 before and after the water-vapor exposure.

FIG. 7 shows the results of measurement of the electrical resistivity of the material of Example 7 before and after the water-vapor exposure test. This graph shows little change in the superconductivity, which proves the good endurance to water of the material of the present invention. Other typical superconducting oxide materials of Bi-system are known to be more sensitive to water. Table 1 shows the decrease of Tc by the water-vapor exposure test in other Examples, which proves the superior endurance of the material of the present invention.

Figure 8:
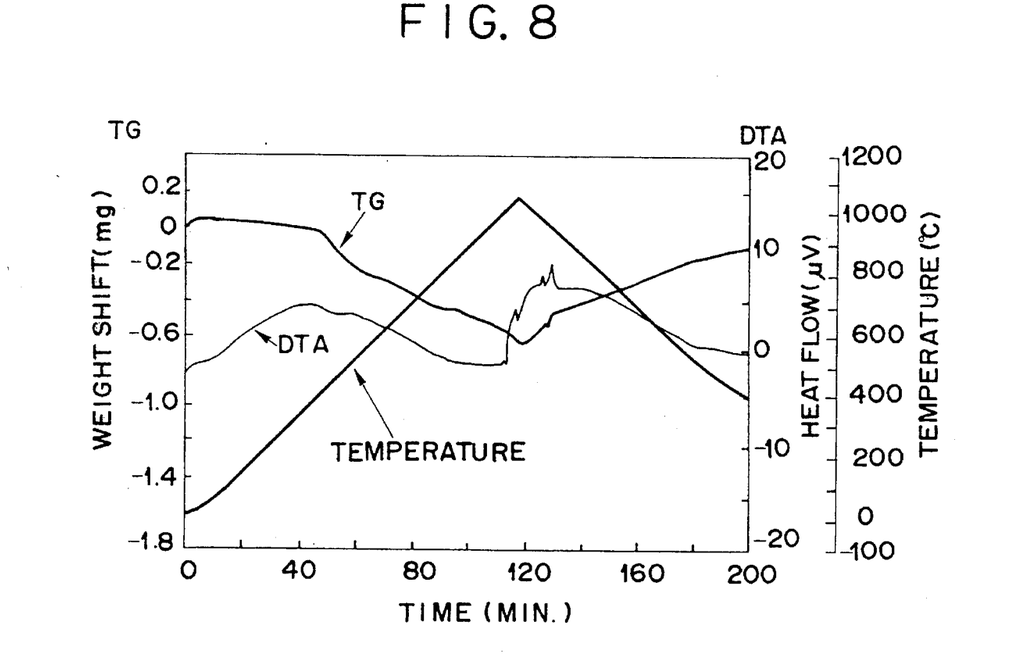
FIG. 8 shows the temperature dependences of TG and DTA of the $YSr_2Cu_{2.75}Re_{0.25}O_{7.2}$ prepared in Example 7.

FIG. 8 shows the result of measurement of TG and DTA of the material of Example 7. The amount of the sample used in the measurement was 50.4 mg. From FIG. 8, the loss of the oxygen from the metal oxide material of the present invention at 900° C. amounts to 1% by weight, corresponding to approximately 0.34 oxygen atom in the composition formula. This oxygen loss is about ⅓ as compared with that of the $YBa_2Cu_3O_7$ of Comparative Example which loses oxygen in an amount of 2.4% by weight corresponding to one oxygen atom. Thus the metal oxide material of the present invention deteriorates less than the ones of Comparative Examples. The same results as in FIG. 5, FIG. 7, and FIG. 8 are obtained in other Examples.

EXAMPLES 8 TO 13 AND COMPARATIVE EXAMPLES 7 TO 12

The starting materials used were $Y_2O_3$, $Gd_2O_3$, $EF_2O_3$, $Ho_2O_3$, $TiO_2$, $Ga_2O_3$, $ReO_3$, $SrCO_3$, and CuO. These materials were weighed out in desired composition ratios, and mixed at dry. The respective mixtures were reacted and sintered in the same manner as described above to prepare the compounds of the Examples of the present invention and Comparative Examples. These samples were subjected to measurement of electric resistivity and measurement of magnetic susceptibility.

Table 3 shows the compositions and the transition temperature (K) of the compounds of Examples 8 to 13. Table 4 shows the nominal compositions and the electric characteristics of the samples of Comparative Examples 7 to 12. The composition ratios were measured by EPMA, so that the quantity of the oxygen may involve an error of about 20%.

Table 3 shows that the metal oxide materials within the composition ratio range of the present invention all become superconductors having Tc=20K of higher. Table 4 shows that the materials of Comparative Examples outside the range of the composition of the present invention do not exhibit superconductivity transition, or come to have zero resistance at a temperature of 10K or lower if the materials exhibit superconductivity transition. The materials of Comparative Examples have inferior characteristics with the superconductivity volume fraction of not more than 3%.

At the right column of Table 3, the values of decrease of Tc at the water-vapor exposure test conducted in the same manner as in Examples 1 to 7 are shown. From the values, the materials of the present invention have good endurance.

TABLE 3

| Example No. | Composition | Characteristic (Tc) | Decrease of Tc after water-vapor exposure test (ΔTc) |
|---|---|---|---|
| 8 | $YSr_2Cu_{2.92}Re_{0.08}O_{6.8}$ | 40K | −3K |
| 9 | $YSr_2Cu_{2.4}Ga_{0.6}O_{7.1}$ | 25K | −3K |
| 10 | $Gd_{0.5}Er_{0.5}Sr_2Cu_{2.7}Ti_{0.3}O_{6.8}$ | 27k | −2K |
| 11 | $YSr_2Cu_{2.7}Ga_{0.2}Re_{0.1}O_{7.0}$ | 48k | −4K |
| 12 | $Ho_{0.9}Sr_{1.9}Cu_{2.8}Re_{0.2}O_{7.0}$ | 31K | −3K |
| 13 | $Ho_{1.1}Sr_{2.1}Cu_{2.8}Re_{0.2}O_{7.0}$ | 26K | −4K |

TABLE 4

| Comparative Example No. | Nominal composition | Characteristic (Tc) |
|---|---|---|
| 7 | $YSr_2Cu_{2.97}Re_{0.03}O_y$ | semi-conductor |
| 8 | $YSr_2Cu_{2.2}Ga_{0.8}O_y$ | semi-conductor |
| 9 | $Y_{0.7}Sr_2Cu_{2.6}Ga_{0.4}O_y$ | 8K |
| 10 | $Y_{1.3}Sr_2Cu_{2.6}Ga_{0.4}O_y$ | semi-conductor |
| 11 | $YSr_{1.7}Cu_{2.6}Ga_{0.4}O_y$ | 9K |
| 12 | $YSr_{2.3}Cu_{2.6}Ga_{0.4}O_y$ | semi-conductor |

EXAMPLE 14 TO 21

The starting materials used were $Y_2O_3$, $Ho_2O_3$, $Dy_2O_3$, $Gd_2O_3$, $La_2O_3$, $Sm_2O_3$, $Er_2O_3$, $Yb_2O_3$, $Ga_2O_3$, $SrCO_3$, and CuO. These materials were weighed out in desired composition ratios, and mixed at dry. The respective mixtures were reacted and sintered in the same manner as described above to prepare the compounds of the Examples of the present invention. The samples were subjected to measurement of electric resistivity and magnetic susceptibility.

Table 5 shows the compositions and the electric characteristics of the samples of Examples 14 to 17. Table 6 shows the compositions and the electric characteristics of the samples of Example 18 to 21, and the transition temperatures (K) if the sample is superconducting.

The X-ray diffraction patterns of the material of Examples 14 to 17 are nearly the same as that of FIG. 2, showing the similar structures of these material. The superconductivity volume fraction was more than 10%.

The metal oxide materials of Examples 18 to 21 shown in Table 6 are the ones within the present invention. However, these metal oxides, which employ, as Ln, only one element other than Y, Ho, Dy, and Gd, have inferior characteristics. Accordingly, if a lanthanoid element other than Y, Ho, Dy, and Gd is used, it is preferable to use the element in combination with Y or with one or more other lanthanoid elements as in Example 10. When only one lanthanoid element is used, Y, Ho, Dy, or Gd is preferred as the Ln elements.

At the right columns of Tables 5 and 6, the values of decrease of Tc at the water-vapor exposure test conducted in the same manner as in Examples 1 to 7 are shown. From the values, the materials of the present invention have shown good endurance.

TABLE 5

| Example No. | Composition | Characteristic (Tc) | Decrease of Tc after water-vapor exposure test (ΔTc) |
|---|---|---|---|
| 14 | $YSr_2Cu_{2.6}Ga_{0.4}O_{7.1}$ | 35K | −3K |
| 15 | $HoSr_2Cu_{2.6}Ga_{0.4}O_{7.1}$ | 35K | −4K |
| 16 | $DySr_2Cu_{2.6}Ga_{0.4}O_7$ | 31K | −2K |
| 17 | $GdSr_2Cu_{2.6}Ga_{0.4}O_7$ | 26K | −3K |

TABLE 6

| Example No. | Composition | Characteristic (Tc) | Decrease of Tc after water-vapor exposure test (ΔTc) |
|---|---|---|---|
| 18 | $LaSr_2Cu_{2.6}Ga_{0.4}O_{7.0}$ | 20K | −4K |
| 19 | $SmSr_2Cu_{2.6}Ga_{0.4}O_{7.0}$ | 22K | −3K |
| 20 | $ErSr_2Cu_{2.6}Ga_{0.4}O_{7.0}$ | 24K | −2K |
| 21 | $YbSr_2Cu_{2.6}Ga_{0.4}O_{7.0}$ | 20K | −3K |

EXAMPLES 22 TO 35 AND COMPARATIVE EXAMPLES 13 TO 26

The materials shown in Tables 7 and 8 were reacted and sintered in the same manner as describe above to prepare the compounds of Examples of the present invention and Comparative Examples.

The X-ray patterns of the materials of Examples 22 to 35 are nearly the same as the one of FIG. 2, showing the similar structures of these materials. The temperature dependence of the magnetic susceptibility of these materials were similar to that of FIG. 4, and the superconductivity volume fractions were more than 10%, showing superior characteristics.

From Tables 7 and 8, satisfactory superconductivity characteristics are obtained with the compound $YSr_2Cu_{3-x}M_xO_y$ regarding the element M.

M=Ti: $0.2 \leq x \leq 0.5$
M=V: $0.05 \leq x \leq 0.4$
M=Ga: $0.25 \leq x \leq 0.7$
M=Ge: $0.05 \leq x \leq 0.4$
M=Mo: $0.05 \leq x \leq 0.4$
M=W: $0.05 \leq x \leq 0.4$
M=Re: $0.05 \leq x \leq 0.4$ At the right columns of Table 7, the values of decrease of Tc at the water-vapor exposure test conducted in the same manner as in Examples 1 to 7 are shown. From the values, the materials of the present invention have shown good endurance.

TABLE 7

| Example No. | Composition | Characteristic (Tc) | Decrease of Tc after water-vapor exposure test (ΔTc) |
|---|---|---|---|
| 22 | $YSr_2Cu_{2.78}Ti_{0.22}O_{7.0}$ | 26K | −3K |
| 23 | $YSr_2Cu_{2.55}Ti_{0.45}O_{7.1}$ | 31K | −2K |
| 24 | $YSr_2Cu_{2.9}V_{0.1}O_{7.1}$ | 25K | −2K |
| 25 | $YSr_2Cu_{2.65}V_{0.35}O_{7.2}$ | 26K | −3K |
| 26 | $YSr_2Cu_{2.7}Ga_{0.3}O_{6.9}$ | 31K | −4K |
| 27 | $YSr_2Cu_{2.35}Ga_{0.65}O_{7.1}$ | 27K | −3K |
| 28 | $YSr_2Cu_{2.9}Ge_{0.1}O_{6.9}$ | 31K | −3K |
| 29 | $YSr_2Cu_{2.65}Ge_{0.35}O_7$ | 26K | −3K |
| 30 | $YSr_2Cu_{2.9}Mo_{0.1}O_{6.9}$ | 62K | −5K |
| 31 | $YSr_2Cu_{2.65}Mo_{0.35}O_{7.4}$ | 27K | −1K |
| 32 | $YSr_2Cu_{2.9}W_{0.1}O_{7.1}$ | 38K | −3K |
| 33 | $YSr_2Cu_{2.65}W_{0.35}O_{7.4}$ | 25K | −2K |
| 34 | $YSr_2Cu_{2.9}Re_{0.1}O_{6.9}$ | 45K | −5K |
| 35 | $YSr_2Cu_{2.65}Re_{0.35}O_{7.5}$ | 26K | −3K |

TABLE 8

| Comparative Example No. | Nominal composition | Characteristic (Tc) |
|---|---|---|
| 13 | $YSr_2Cu_{2.85}Ti_{0.15}O_y$ | 8K |
| 14 | $YSr_2Cu_{2.4}Ti_{0.6}O_y$ | semi-conductor |
| 15 | $YSr_2Cu_{2.97}V_{0.03}O_y$ | semi-conductor |
| 16 | $YSr_2Cu_{2.55}V_{0.45}O_y$ | semi-conductor |
| 17 | $YSr_2Cu_{2.78}Ga_{0.22}O_y$ | 9K |
| 18 | $YSr_2Cu_{2.2}Ga_{0.8}O_y$ | semi-conductor |
| 19 | $YSr_2Cu_{2.97}Ga_{0.03}O_y$ | 9K |
| 20 | $YSr_2Cu_{2.5}Ge_{0.5}O_y$ | semi-conductor |
| 21 | $YSr_2Cu_{2.97}Mo_{0.03}O_y$ | 9k |
| 22 | $YSr_2Cu_{2.5}Mo_{0.5}O_y$ | semi-conductor |
| 23 | $YSr_2Cu_{2.97}W_{0.03}O_y$ | 8K |
| 24 | $YSr_2Cu_{2.5}W_{0.5}O_y$ | semi-conductor |
| 25 | $YSr_2Cu_{2.97}Re_{0.03}O_y$ | 9K |
| 26 | $YSr_2Cu_{2.5}Re_{0.5}O_y$ | semi-conductor |

Next, the Ca-substituted metal oxide material of the present invention is described more specifically by reference to Examples.

EXAMPLES 36 TO 43 AND COMPARATIVE EXAMPLES 27 TO 31

The starting materials used were $Y_2O_3$, $SrCO_3$, $CaCO_3$, CuO, $TiO_2$, $V_2O_5$, $GeO_2$, $MoO_3$, $WO_3$, $ReO_3$, $Al_2O_3$, $MnO_2$, NiO, $Fe_2O_3$, and $Co_2O_3$. These materials were weighed out in desired composition ratios, and mixed and dried. The respective mixtures were pressed into pellets with 10 mm in diameter and 1 mm thick. Each of the formed pellets was reacted and sintered in an alumina boat at a temperature of 950° to 1100° C. in the air or in an oxygen atmosphere to prepare the compounds of Example or Comparative Example of the present invention. The samples prepared in such a manner were subjected to measurement of electric resistivity by a four-probe method and measurement of magnetic susceptibility by means of a SQUID in the temperature range of from room temperature to the liquid helium temperature.

Table 9 shows the composition ratios and the transition temperatures (K) of the samples of Examples 36 to 43. Table 10 shows the nominal compositions and the electric characteristics of the samples of Comparative Examples 27 to 31. The composition ratios were measured by EPMA, so that the quantity of the oxygen may involve an error of about 20%.

Table 9 shows that all of the materials of Examples of the present invention are superconductors having Tc=25K. or higher. The replacement of copper with Fe, Mo, W, or Re gives superior characteristics especially suitable for a superconductor.

Table 10 shows that the materials prepared in Comparative Examples 27–31 in which the M is an element other than Fe, Co, Ti, V, Ge, Mo, W, and Re do not exhibit superconducting transition.

At the right column of Table 9, the values of decrease of Tc at the water-vapor exposure test conducted in the same manner as in Examples 1–7 are shown. From the values, the materials of the present invention have shown good endurance.

TABLE 9

| Example No. | Composition | Characteristic (Tc) | Decrease of Tc after water-vapor exposure test ($\Delta$Tc) |
|---|---|---|---|
| 36 | $Y_{0.8}Ca_{0.2}Sr_2Cu_{2.85}Re_{0.15}O_{7.2}$ | 51K | −4K |
| 37 | $Y_{0.9}Ca_{0.1}Sr_2Cu_{2.65}Ti_{0.35}O_{7.1}$ | 37K | −4K |
| 38 | $Y_{0.8}Ca_{0.2}Sr_2Cu_{2.7}Ge_{0.3}O_{7.0}$ | 30K | −3K |
| 39 | $Y_{0.9}Ca_{0.1}Sr_2Cu_{2.85}Mo_{0.15}O_{7.0}$ | 68K | −7K |
| 40 | $Y_{0.8}Ca_{0.2}Sr_2Cu_{2.85}W_{0.15}O_{7.1}$ | 49K | −5K |
| 41 | $Y_{0.9}Ca_{0.1}Sr_{1.9}Cu_{2.75}Fe_{0.25}O_{7.2}$ | 60K | −7K |
| 42 | $Y_{0.8}Ca_{0.2}Sr_2Cu_{2.6}Co_{0.4}O_{7.0}$ | 26K | −4K |
| 43 | $Y_{0.8}Ca_{0.2}Sr_2Cu_{2.7}V_{0.3}O_{7.0}$ | 29K | −4K |

TABLE 10

| Comparative Example No. | Nominal composition | Characteristic (Tc) |
|---|---|---|
| 27 | $Y_{0.5}Ca_{0.5}Sr_2Cu_3O_y$ | semi-conductor |
| 28 | $YCaSrCu_3O_y$ | semi-conductor |
| 29 | $Y_{0.8}Ca_{0.2}Sr_2Cu_{2.7}Al_{0.3}O_y$ | semi-conductor |
| 30 | $Y_{0.8}Ca_{0.2}Sr_2Cu_{2.6}Mn_{0.4}O_y$ | semi-conductor |
| 31 | $Y_{0.8}Ca_{0.2}Sr_2Cu_{2.6}Ni_{0.4}O_y$ | semi-conductor |

Figure 9:
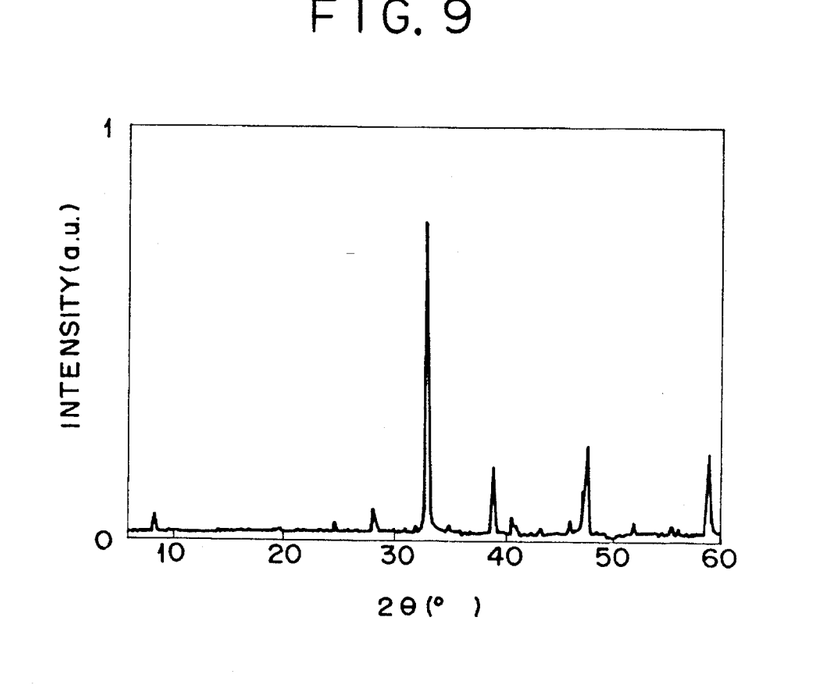
FIG. 9 shows the X-ray diffraction patterns for the $Y_{0.8}Ca_{0.2}Sr_2Cu_{2.85}Re_{0.15}O_{07.2}$ prepared in Example 36, employing the GuKα radiation.

FIG. 9 shows the X-ray diffraction pattern of the metal oxide material prepared in Example 36. From FIG. 9, the sample prepared in Example 36 has a tetragonal structure with lattice dimensions of a=b =3.83 Å, c=11.5 Å. The materials prepared in other Examples were found to exhibit nearly the same diffraction patterns, thus having the same structure.

Figure 10:
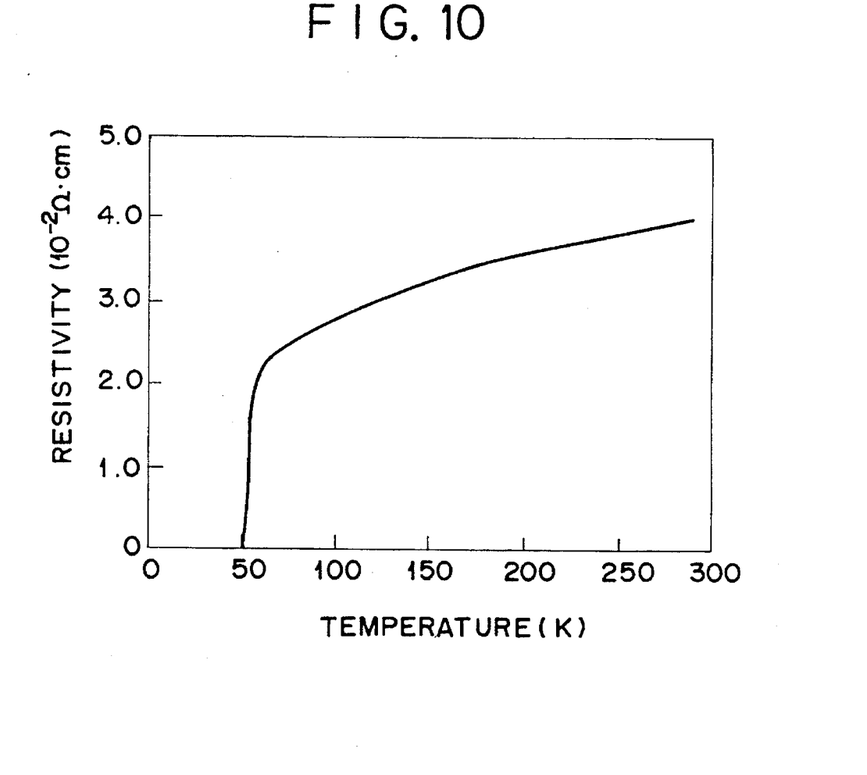
FIG. 10 shows the temperature dependence of the resistivity of the $Y_{0.8}Ca_{0.2}Sr_2Cu_{2.85}Re_{0.15}O_{7.2}$ prepared in Example 36.

FIG. 10 is a graph showing the temperature dependence of the electrical resistivity of this sample, showing that the superconductivity transition begins at approximately 59K and the resistance reaches zero at 51K. Hence, the compounds of the present invention become a superconductor at a temperature much higher than the liquid helium temperature.

Figure 11:
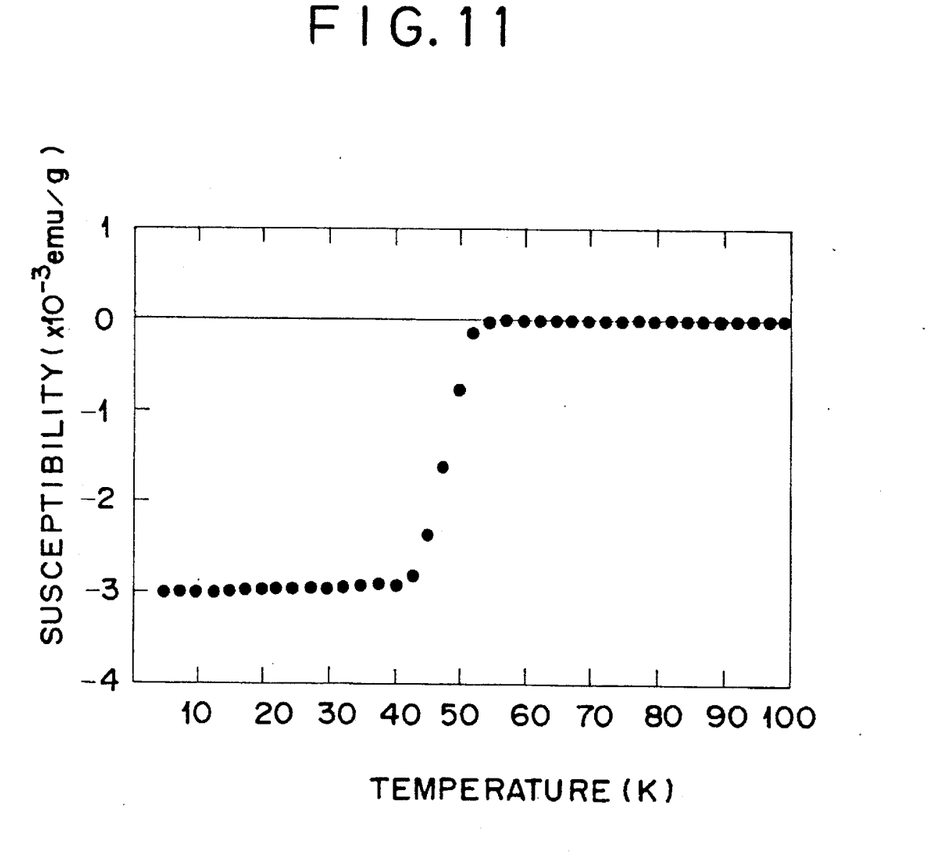
FIG. 11 shows the temperature dependence of the magnetic susceptibility of the $Y_{0.8}Ca_{0.2}Sr_2Cu_{2.85}Re_{0.15}O_{7.2}$ prepared in Example 36.

FIG. 11 shows the result of the measurement of temperature dependence of magnetic susceptibility of the metal oxide material prepared in Example 36. The sample of Example 36 exhibits Meissner signal below 55K, and the superconducting volume fraction thereof exceeds 20% at 10K. The other metal oxide materials prepared in Examples 37 to 43 were found to give similar results and to have sufficient superconductivity.

In comparison of the material of the present invention with the data for $YSr_2Cu_{3-x}Fe_xO_7$ shown in FIG. 1 cited from Chemistry of Materials, Vol. 1, 331 (1989), the material of the present invention has a much higher zero-resistivity-temperature and a much higher superconductivity volume fraction.

The specific gravity of the compound of Example 36 is 5.5 g/cm$^3$, being lower by approximately 30% than existing copper oxide superconductors such as $YBa_2Cu_3O_7$. The other materials prepared in Examples 37 to 43 also have a specific gravity of not higher than 6 g/cm$^3$, thereby being of sufficiently light weight.

EXAMPLES 44 TO 50 AND COMPARATIVE EXAMPLES 32 TO 35

The starting materials used were $Y_2O_3$, $Gd_2O_3$, $Er_2O_3$, $Dy_2O_3$, $TiO_2$, $V_2O_5$, $ReO_3$, $SrCO_3$, $CaCO_3$, and CuO. These materials were weighed out in desired composition ratios, and mixed at dry. The respective mixtures were reacted and sintered in the same manner as described above to prepare the compounds of the Examples of the present invention and Comparative Examples. The samples were subjected to measurement of electric resistivity and magnetic susceptibility.

Table 11 shows the compositions of the compounds and the transition temperature (K) thereof in Examples 44 to 50. Table 12 shows the nominal compositions and the electric characteristics of the samples of Comparative Examples 32 to 35. The composition ratios were measured by EPMA, so that the quantity of the oxygen may involve an error of about 20%.

The materials prepared in Examples 44 to 50 shown in Table 11 are within the composition range of the present invention. The materials of Examples 44 to 50 have the composition ratio of $Ln_aCa_bSr_cCu_{3-x}M_xO_d$ where a+b+c=3 for Examples 44 to 46, and $2.7 \leq a+b+c \leq 3.3$ for Example 47 to 50. The materials satisfying the condition of a+b+c=3 have a higher superconductivity transition temperature, and have more desirable characteristics. In Table 11, the materials satisfying the condition of (a+b+c) of the present invention all become a superconductor having Tc=25K or higher.

Table 12 shows that the materials of Comparative Examples outside the range of the composition of the present invention do not exhibit superconductivity transition, or come to have zero resistance at a temperature of 10K or lower even if the materials exhibit superconductivity transition.

The materials of Comparative Examples have inferior characteristics with the superconductivity volume fraction of not more than 3%.

At the right column of Table 11, the values of decrease of Tc at the water-vapor exposure test conducted in the same manner as in Examples 1 to 7 are shown. From the values, the materials of the present invention have shown good endurance.

TABLE 11

| Example No. | Composition | Characteristic (Tc) | Decrease of Tc after water-vapor exposure test ($\Delta$Tc) |
|---|---|---|---|
| 44 | $Y_{0.9}Ca_{0.15}Sr_{1.95}Cu_{2.8}Re_{0.2}O_{7.2}$ | 52K | −4K |
| 45 | $Gd_{0.4}Er_{0.4}Ca_{0.4}Sr_{1.8}Cu_{2.85}Re_{0.15}O_{7.1}$ | 48K | −6K |
| 46 | $Y_{0.9}Ca_{0.2}Sr_{1.9}Cu_{2.75}Fe_{0.1}Re_{0.15}O_{7.1}$ | 51K | −3K |

TABLE 11-continued

| Example No. | Composition | Characteristic (Tc) | Decrease of Tc after water-vapor exposure test (ΔTc) |
|---|---|---|---|
| 47 | $Dy_{0.9}Ca_{0.2}Sr_{1.7}Cu_{2.8}Re_{0.2}O_{7.0}$ | 38K | −5K |
| 48 | $DyCa_{0.2}Sr_2Cu_{2.8}Re_{0.2}O_{7.0}$ | 42K | −5K |
| 49 | $Y_{0.8}Ca_{0.2}Sr_{1.7}Cu_{2.7}V_{0.3}O_y$ | 33K | −3K |
| 50 | $YCa_{0.3}Sr_2Cu_{2.7}V_{0.3}O_y$ | 32K | −4K |

TABLE 12

| Comparative Example No. | Nominal composition | Characteristic (Tc) |
|---|---|---|
| 32 | $Y_{0.5}Ca_{1.5}SrCu_{2.7}V_{0.3}O_y$ | semi-conductor |
| 33 | $Y_{0.8}Ca_{0.2}Sr_2Cu_{2.5}V_{0.5}O_y$ | semi-conductor |
| 34 | $Y_{0.6}Ca_{0.2}Sr_{1.8}Cu_{2.7}V_{0.3}O_y$ | 6K |
| 35 | $Y_{1.4}Ca_{0.5}Sr_{1.5}Cu_{2.7}V_{0.3}O_y$ | 5K |

EXAMPLES 51 TO 53 AND COMPARATIVE EXAMPLES 36 TO 38

The materials shown in Tables 13 and 14 were reacted and sintered in the same manner as describe above to prepare the compounds of Examples of the present invention and Comparative Examples.

The X-ray diffraction patterns of the materials of Examples 51 to 53 are nearly the same as that of FIG. 9, showing the similar structures of these materials. The temperature dependence of the magnetic susceptibility of these materials were similar to that of FIG. 11, and the superconductivity volume fractions were more than 10%, showing superior characteristics.

In Tables 13 and 14, the composition of $Ln_aCa_bSr_cCu_{3-x}M_xO_d$ (wherein a+b+c=3) gives satisfactory superconductivity within the range of 0.03 ¾ b ¾ 1.2 of the Ca substitution.

At the right column of Table 13, the values of decrease of Tc at the water-vapor exposure test conducted in the same manner as in Examples 1 to 7 are shown. From the values, the materials of the present invention have shown good endurance.

TABLE 13

| Example No. | Composition | characteristic (Tc) | Decrease of Tc after water-vapor exposure test (ΔTc) |
|---|---|---|---|
| 51 | $Y_{0.92}Ca_{0.08}Sr_2Cu_{2.6}Co_{0.4}O_{7.0}$ | 27K | −3K |
| 52 | $Y_1Ca_{0.08}Sr_{1.92}Cu_{2.6}Co_{0.4}O_{7.0}$ | 29K | −3K |
| 53 | $Y_{0.5}Ca_1Sr_{1.5}Cu_{2.6}Co_{0.4}O_{7.0}$ | 26K | −5K |

TABLE 14

| Comparative Example No. | Nominal composition | Characteristic (Tc) |
|---|---|---|
| 36 | $Y_{0.97}Ca_{0.03}Sr_2Cu_{2.6}Co_{0.4}O_y$ | 9K |
| 37 | $Y_1Ca_{0.03}Sr_{1.97}Cu_{2.6}Co_{0.4}O_y$ | 9K |
| 38 | $Y_{0.4}Ca_{1.2}Sr_{1.4}Cu_{2.6}Co_{0.4}O_y$ | semi-conductor |

EXAMPLES 54 TO 69 AND COMPARATIVE EXAMPLES 39 TO 54

The mixed starting materials shown in Tables and 16 were reacted and sintered in the same manner as describe above to prepare the compounds of Examples of the present invention and Comparative Examples.

The X-ray diffraction patterns of the material of Examples 54 to 69 are nearly the same as that of FIG. 9, showing the similar structures of these materials.

The temperature dependence of the magnetic susceptibility of these materials were similar to that of FIG. 11, and the superconductivity volume fractions were more than 10%, showing superior characteristics.

From Tables 15 and 16, satisfactory superconductivity characteristics are obtained with the compound $Ln_aCa_bSr_cCu_{3-x}M_xO_d$ (wherein a+b+c=3) within the range of x regarding the element M.

M=Fe: $0.2 \leq x \leq 1.0$

M=Co: $0.2 \leq x \leq 1.0$

M=Ti: $0.2 \leq x \leq 0.5$

M=V: $0.05 \leq x \leq 0.4$

M=Ge: $0.05 \leq x \leq 0.4$

M=Mo: $0.05 \leq x \leq 0.4$

M=W: $0.05 \leq x \leq 0.4$

M=Re: $0.05 \leq x \leq 0.4$

At the right columns of Table 15, the values of Tc decrease at the water-vapor exposure test conducted in the same manner as in Examples 1 to 7 as shown. From the values, the materials of the present invention have shown good endurance.

TABLE 15

| Example No. | Composition | characteristic (Tc) | Decrease of Tc after water-vapor exposure test (ΔTc) |
|---|---|---|---|
| 54 | $Y_{0.8}Ca_{0.4}Sr_{1.8}Cu_{2.75}Fe_{0.25}O_{7.2}$ | 55K | −6K |
| 55 | $Y_{0.8}Ca_{0.4}Sr_{1.8}Cu_{2.2}Fe_{0.8}O_{7.4}$ | 26K | −4K |
| 56 | $Y_{0.8}Ca_{0.4}Sr_{1.8}Cu_{2.75}Co_{0.25}O_{7.1}$ | 30K | −5K |
| 57 | $Y_{0.8}Ca_{0.4}Sr_{1.8}Cu_{2.2}Co_{0.8}O_{7.3}$ | 26K | −4K |
| 58 | $Y_{0.8}Ca_{0.4}Sr_{1.8}Cu_{2.78}Ti_{0.22}O_{7.0}$ | 27K | −3K |
| 59 | $Y_{0.8}Ca_{0.4}Sr_{1.8}Cu_{2.55}Ti_{0.45}O_{7.1}$ | 33K | −5K |
| 60 | $Y_{0.8}Ca_{0.4}Sr_{1.8}Cu_{2.9}V_{0.1}O_{7.1}$ | 27K | −3K |
| 61 | $Y_{0.8}Ca_{0.4}Sr_{1.8}Cu_{2.65}V_{0.35}O_{7.2}$ | 31K | −3K |
| 62 | $Y_{0.8}Ca_{0.4}Sr_{1.8}Cu_{2.9}Ge_{0.1}O_{6.9}$ | 35K | −6K |
| 63 | $Y_{0.8}Ca_{0.4}Sr_{1.8}Cu_{2.65}Ge_{0.35}O_7$ | 29K | −5K |
| 64 | $Y_{0.8}Ca_{0.4}Sr_{1.8}Cu_{2.9}Mo_{0.1}O_{6.9}$ | 62K | −4K |
| 65 | $Y_{0.8}Ca_{0.4}Sr_{1.8}Cu_{2.65}Mo_{0.35}O_{7.4}$ | 29K | −2K |
| 66 | $Y_{0.8}Ca_{0.4}Sr_{1.8}Cu_{2.9}W_{0.1}O_{7.1}$ | 41K | −3K |
| 67 | $Y_{0.8}Ca_{0.4}Sr_{1.8}Cu_{2.65}W_{0.35}O_{7.4}$ | 31K | −4K |
| 68 | $Y_{0.8}Ca_{0.4}Sr_{1.8}Cu_{2.9}Re_{0.1}O_{6.9}$ | 47K | −4K |
| 69 | $Y_{0.8}Ca_{0.4}Sr_{1.8}Cu_{2.65}Re_{0.35}O_{7.5}$ | 30K | −3K |

TABLE 16

| Comparative Example No. | Nominal composition | Characteristic (Tc) |
|---|---|---|
| 39 | $Y_{0.8}Ca_{0.4}Sr_{1.8}Cu_{2.85}Fe_{0.15}O_y$ | 9K |
| 40 | $Y_{0.8}Ca_{0.4}Sr_{1.8}Cu_{1.8}Fe_{1.2}O_y$ | semi-conductor |
| 41 | $Y_{0.8}Ca_{0.4}Sr_{1.8}Cu_{2.85}Co_{0.15}O_y$ | semi-conductor |
| 42 | $Y_{0.8}Ca_{0.4}Sr_{1.8}Cu_{1.8}Co_{1.2}O_y$ | semi-conductor |
| 43 | $Y_{0.8}Ca_{0.4}Sr_{1.8}Cu_{2.85}Ti_{0.15}O_y$ | 8K |
| 44 | $Y_{0.8}Ca_{0.4}Sr_{1.8}Cu_{2.4}Ti_{0.6}O_y$ | semi-conductor |
| 45 | $Y_{0.8}Ca_{0.4}Sr_{1.8}Cu_{2.97}V_{0.03}O_y$ | semi-conductor |
| 46 | $Y_{0.8}Ca_{0.4}Sr_{1.8}Cu_{2.55}V_{0.45}O_y$ | semi-conductor |

TABLE 16-continued

| Comparative Example No. | Nominal composition | Characteristic (Tc) |
| --- | --- | --- |
| 47 | $Y_{0.8}Ca_{0.4}Sr_{1.8}Cu_{2.97}Ge_{0.03}O_y$ | semi-conductor |
| 48 | $Y_{0.8}Ca_{0.4}Sr_{1.8}Cu_{2.5}Ge_{0.5}O_y$ | semi-conductor |
| 49 | $Y_{0.8}Ca_{0.4}Sr_{1.8}Cu_{2.97}Mo_{0.03}O_y$ | 7K |
| 50 | $Y_{0.8}Ca_{0.4}Sr_{1.8}Cu_{2.5}Mo_{0.5}O_y$ | semi-conductor |
| 51 | $Y_{0.8}Ca_{0.4}Sr_{1.8}Cu_{2.97}W_{0.03}O_y$ | 7K |
| 52 | $Y_{0.8}Ca_{0.4}Sr_{1.8}Cu_{2.5}W_{0.5}O_y$ | semi-conductor |
| 53 | $Y_{0.8}Ca_{0.4}Sr_{1.8}Cu_{2.97}Re_{0.03}O_y$ | 8K |
| 54 | $Y_{0.8}Ca_{0.4}Sr_{1.8}Cu_{2.5}Re_{0.5}O_y$ | semi-conductor |

(1) The metal oxide material of the present invention is synthesizable stably at atmospheric pressure in contrast to conventional superconducting materials that are synthesizable only under a superhigh pressure.

(2) The metal oxide material of the present invention is an excellent superconducting material having a superconductivity transition temperature exceeding by far the liquid helium temperature, and having a superconductivity volume fraction of not less than 10%. Accordingly, the metal oxide material of the present invention is practically usable with a simple refrigeration apparatus.

(3) The metal oxide material of the present invention has the lowest specific gravity of known copper oxide materials which are obtained stably, and is particularly effective when used as a bulk material.

(4) In the synthesis of the metal oxide material of the present invention, a toxic material such as heavy metal or barium carbonate is not used in contrast to other copper oxide superconductor, and is therefore safe and inexpensive.

(5) The metal oxide material of the present invention has a good endurance against moisture and water vapor. Therefore, the metal oxide material is naturally useful under various application conditions and wide application fields, and can effectively be used as a device material.

(6) The metal oxide material of the present invention loses even less oxygen at a high temperature. Therefore, less countermeasure is required against the oxygen loss during the production and use of the metal oxide material.

What is claimed is:

1. A metal oxide material represented by the formula of $Ln_aSr_bCu_{3-x}M_xO_c$, where $2.7 \leq a+b \leq 3.3$; $0.8 \leq a \leq 1.2$; $6 \leq c \leq 9$; and $0.05 \leq x \leq 0.7$, Ln is at least one element selected from the group consisting of Y and lanthanoids, and M is Ti.

2. A metal oxide material represented by the formula of $Ln_aCa_bSr_cCu_{3-x}M_xO_d$, where $2.7 \leq a+b+c \leq 3.3$; $0.8 \leq a+b \leq 2.1$; $0.05 \leq b \leq 1.1$; $6 \leq d \leq 9$; and $0.05 \leq X \leq 1.0$, Ln is at least one element selected from the group consisting of Y and lanthanoids, and M is at least one element selected from the group consisting of transition elements of Fe, Co, Ti, V, Ge, Mo, W and combinations thereof, provided that x is no more than 0.4 when M consists of V, Mo, or W.

3. The metal oxide material of claim 1, wherein $0.2 \leq x \leq 0.5$.

4. The metal oxide material of claim 2, wherein M=Fe, and $0.2 \leq x \leq 1.0$.

5. The metal oxide material of claim 2, wherein M=Co, and $0.2 \leq x \leq 1.0$.

6. The metal oxide material of claim 2, wherein M=Ti, and $0.2 \leq x \leq 0.5$.

7. The metal oxide material of claim 2, wherein M=V, and $0.05 \leq x \leq 0.4$.

8. The metal oxide material of claim 2, wherein M=Ge, and $0.05 \leq x \leq 0.4$.

9. The metal oxide material of claim 2, wherein M=Mo, and $0.05 \leq x \leq 0.4$.

10. The metal oxide material of claim 2, wherein M=W, and $0.05 \leq x \leq 0.4$.

* * * * *

UNITED STATES PATENT AND TRADEMARK OFFICE
CERTIFICATE OF CORRECTION

PATENT NO. : 5,583,093

DATED : December 10, 1996

INVENTORS : Tohru Den et al.

It is certified that error appears in the above-identified patent and that said Letters Patent is hereby corrected as shown below:

<u>ON TITLE PAGE</u>, Items

[62] Related U.S. Application Data

"Jun. 20, 1994," should read --June 27, 1994,--.

[56] References Cited

"01108147  4/1949  Japan" should read --1-108147  4/1989--;

"1122959   5/1989  Japan.   1160821  6/1989  Japan.
 00160821  6/1989  Japan.   1179719  7/1989  Japan.
 1176219   7/1989  Japan.   1176219  7/1989  Japan.
 1212230   8/1989  Japan.   1212229  8/1989  Japan.
 1264954  10/1989  Japan.   2164759  6/1990  Japan."

should read

--1-122959  5/1989  Japan.   1-160821  6/1989  Japan.
  1-179719  7/1989  Japan.   1-176219  7/1989  Japan.
  1-176218  7/1989  Japan.   1-212230  8/1989  Japan.
  1-212229  8/1989  Japan.   1-264954 10/1989  Japan.
  2-164759  6/1990  Japan.--

[56] References Cited

Under "Den, Tohru, et al. , "1 & 2)" should read --(1 & 2)--.

UNITED STATES PATENT AND TRADEMARK OFFICE
CERTIFICATE OF CORRECTION

PATENT NO. : 5,583,093

DATED : December 10, 1996

INVENTORS : Tohru Den et al.

It is certified that error appears in the above-identified patent and that said Letters Patent is hereby corrected as shown below:

COLUMN 1

Line 6,  "Jun. 20, 1994," should read --June 27, 1994,--;
Line 36, "St, " should read --Sr,--;
Line 50, "St-based" should read --Sr-based--;
Line 63, "St-based" should read --Sr-based--;
Line 64, "small in" should read --small amount--.

COLUMN 3

Line 4,  "one elements" should read --one element--;
Line 33, "$O_{07.2}$" should read --$O_{7.2}$--.

COLUMN 5

Line 67, "at dry." should read --and dried.--.

COLUMN 7

Line 8,  "materials." should read --materials--;
Line 22, "light" should read --light.--;
Line 34, "exhibiten" should read --exhibited--;
Line 67, "at dry." should read --and dried.--.

UNITED STATES PATENT AND TRADEMARK OFFICE
CERTIFICATE OF CORRECTION

PATENT NO. : 5,583,093

DATED : December 10, 1996

INVENTORS : Tohru Den et al.

It is certified that error appears in the above-identified patent and that said Letters Patent is hereby corrected as shown below:

COLUMN 8

Line 57, "at dry." should read --and dried.--.

COLUMN 9

Line 58, "regarding" should read --within the range of x regarding--;

COLUMN 10

Line 1, "columns" should read --column--.

COLUMN 12

Line 18, "at dry." should read --and dried.--.

COLUMN 13

Line 40, "0.03 3/4 b 3/4 1.2" should read $--0.03 \leq b \leq 1.2--$.

UNITED STATES PATENT AND TRADEMARK OFFICE
CERTIFICATE OF CORRECTION

PATENT NO. : 5,583,093

DATED : December 10, 1996

INVENTORS : Tohru Den et al.

It is certified that error appears in the above-identified patent and that said Letters Patent is hereby corrected as shown below:

COLUMN 14

Line 28, "columns" should read --column--.

COLUMN 16

Line 13, "$0.05 \leq X \leq 1.0$," should read --$0.05 \leq X \leq 1.0$,--.

Signed and Sealed this

Twenty-ninth Day of July, 1997

Attest:

BRUCE LEHMAN

Attesting Officer      Commissioner of Patents and Trademarks